United States Patent
Buse et al.

(10) Patent No.: US 7,833,345 B2
(45) Date of Patent: Nov. 16, 2010

(54) TREATMENT OF CRYSTALS IN ORDER TO AVOID LIGHT-INDUCED MODIFICATIONS OF THE REFRACTIVE INDEX

(75) Inventors: Karsten Buse, Bonn (DE); Matthias Falk, Bonn (DE); Konrad Peithmann, Bonn (DE)

(73) Assignee: Deutsche Telekom AG, Bonn (DE)

( * ) Notice: Subject to any disclaimer, the term of this patent is extended or adjusted under 35 U.S.C. 154(b) by 622 days.

(21) Appl. No.: 10/597,199

(22) PCT Filed: Sep. 30, 2004

(86) PCT No.: PCT/DE2004/002176

§ 371 (c)(1), (2), (4) Date: Jul. 14, 2006

(87) PCT Pub. No.: WO2005/068690

PCT Pub. Date: Jul. 28, 2005

(65) Prior Publication Data

US 2007/0155004 A1    Jul. 5, 2007

(30) Foreign Application Priority Data

Jan. 14, 2004  (DE) .................. 10 2004 002 109

(51) Int. Cl.
*C30B 29/30* (2006.01)
*H01L 21/322* (2006.01)

(52) U.S. Cl. ................... 117/1; 117/2; 117/3

(58) Field of Classification Search ............ 117/2, 117/3, 951
See application file for complete search history.

(56) References Cited

U.S. PATENT DOCUMENTS

| | | | | |
|---|---|---|---|---|
| 3,346,344 A | * | 10/1967 | Nassau et al. | 117/29 |
| 3,700,912 A | | 10/1972 | Glass et al. | |
| 3,703,328 A | * | 11/1972 | Glass et al. | 359/7 |
| 3,799,642 A | * | 3/1974 | Phillips et al. | 359/7 |
| 3,846,722 A | * | 11/1974 | deKlerk | 333/193 |
| 3,932,299 A | * | 1/1976 | Phillips | 430/1 |
| 4,396,246 A | * | 8/1983 | Holman | 385/10 |
| 5,448,447 A | * | 9/1995 | Chang | 361/529 |

(Continued)

FOREIGN PATENT DOCUMENTS

DE         10300080         7/2004

OTHER PUBLICATIONS

A.A. Bukharaev et al.: "Investigation of iron impurity centres in lithium niobate", Fizika Tverdogo Tela, USSR, Feb. 1976, ISSN 0367-3294, Soviet Physics—Solid State, USA, ISSN 0038-5654, XP-002320127 (1 page).

(Continued)

*Primary Examiner*—Robert M Kunemund
*Assistant Examiner*—G. Nagesh Rao
(74) *Attorney, Agent, or Firm*—Leydig, Voit & Mayer, Ltd.

(57) ABSTRACT

A method for the treatment of a crystal, such as a lithium niobate crystal or lithium tantalate crystal, having nonlinear optical properties. The crystal comprises foreign atoms which bring about specific absorption of radiated light. The foreign atoms are transformed into a lower valent state by means of oxidation. Electrons, which are released during oxidation, are discharged from the crystal with the aid of an external power source.

9 Claims, 2 Drawing Sheets

U.S. PATENT DOCUMENTS

| | | | | |
|---|---|---|---|---|
| 5,902,519 | A | * | 5/1999 | Stoll ........................... 252/584 |
| 5,904,912 | A | * | 5/1999 | Kitamura et al. ......... 423/594.8 |
| 6,652,780 | B2 | * | 11/2003 | Stoll ........................... 252/584 |
| 6,670,079 | B1 | * | 12/2003 | Kitamura et al. ............... 430/1 |
| 2002/0088966 | A1 | * | 7/2002 | Stoll ........................... 252/584 |
| 2003/0064294 | A1 | * | 4/2003 | Kitamura et al. ............... 430/1 |
| 2006/0291519 | A1 | * | 12/2006 | Buse et al. .................... 372/68 |
| 2007/0155004 | A1 | * | 7/2007 | Buse et al. ............... 435/262.5 |

OTHER PUBLICATIONS

K. Buse et al.: "Development of thermally fixed holograms in photorefractive lithium-niobate crystals without light", Optical Materials 18 (2001), Elsevier Science B.V., pp. 17-18 (2 pages).

K. Buse: "Light-induced charge transport processes iin photrefractive crystals II: Materials", Applied Physics B (Lasers and Optics) vol. 64, 1997, Springer-Verlag, pp. 391-407 (17 pages).

A. Dhar: "Optical properties of reduced lithium niobate single crystals", Jounal of Applied Physics 68 (Dec. 1, 1990, No. 11, New York, pp. 5804-5809 (6 pages).

L. Galambos et al.: "Doubly doped stoichiometric and congruent lithium niobate for holographic data storage", Journal of Crystal Growth 229 (2001), Elsevier Science B.V., pp. 228-232 (5 pages).

N. Y. Kamber et al.: "Threshold effect of incident light intensitty for the resistance against the photorefractive light-induced scattering in doped lithium niobate crystals", Optics Communications 176, Mar. 15, 2000, Elsevier Schience B.V., pp. 91-96 (6 pages).

T. Zhang et al.: "Optical damage resistance of In:Fe:LiNbO$_3$ crystals related to the defect structure", Materials Letters 58 (2004), science direct, Elsevier B.V., pp. 3074-3078 (5 pages).

* cited by examiner

TREATMENT OF CRYSTALS IN ORDER TO AVOID LIGHT-INDUCED MODIFICATIONS OF THE REFRACTIVE INDEX

CROSS REFERENCE TO PRIOR RELATED APPLICATIONS

This is the U.S. national phase under 35 U.S.C. §371 of International Patent Application No. PCT/DE2004/002176, filed Sep. 30, 2004, and claims benefit of German Patent Application No. 10 2004 002 109.0, filed Jan. 14, 2004, the entire subject matter of which is incorporated by reference herein. The International Application was published in German on Jul. 28, 2005 as WO 2005/068690 A1.

FIELD OF ART

The present invention relates to a method for treating a crystal having nonlinear optical properties, such as a lithium niobate crystal or lithium tantalate crystal, the crystal including foreign atoms which bring about specific absorption of incoming light, the foreign atoms being converted to a lower valency state by oxidation, so that they subsequently go to a higher, in particular the highest possible positively charged state.

BACKGROUND

Electro-optic crystals, such as the aforementioned $LiNbO_3$ and $LiTaO_3$ crystals, are known to change their refractive index in response to electric fields externally applied or developed internally. In addition, these crystals are ferroelectric and, therefore, have a preferred axis ("spontaneous polarization"), whose direction can be changed ("poling"). Oxidic crystals of this kind are needed for a multitude of applications in information and communication technology, for light generation, as data storage devices, and for integrated optics. For example, it is possible to holographically store Bragg gratings in the crystals. These are then used as narrow-band wavelength filters or as reflectors for lasers.

Moreover, so-called "periodically poled" material ("periodically poled lithium niobate/tantalate", PPLN/PPLT), in which the direction of the spontaneous polarization changes regularly, resulting in the formation of periodically arranged ferroelectric domains, is suitable for building frequency doublers for laser light (SHG, "second harmonic generation") or optical parametric oscillators (OPOs). $LiNbO_3$ and $LiTaO_3$ crystals are also used as substrate material for waveguides. In particular, these crystals allow integrated optical components to be implemented monolithically together with the applications mentioned above. In this context, the electro-optic effect allows fast modulators to be produced by applying fields to the wave-guiding structure. As is known, doping is used to selectively influence the optical properties of the crystals used.

In particular, frequency conversion in periodically poled material is of great interest for new powerful light sources. Here, the light is often focused in the material to improve the conversion efficiency using high light intensities. Furthermore, the light sources that can be built based on frequency conversion are desired to have high output powers. However, to be able to guarantee reliable operation of the components, these components need to be optimized for use with high light intensities.

A disadvantage here is that high light intensities change the refractive index, and thus the optical properties of the crystal (photorefractive effect or "optical damage"). In particular, inhomogeneous illumination enables charge carriers in the material to move, causing them to be redistributed by drift, diffusion, and/or by the bulk photovoltaic effect, to build up space charge electric fields in the crystal, and thus, to change the refractive index via the electro-optic effect. Impurities in the crystal, which serve as donors or acceptors for the necessary charge carriers and which, as is generally known, are provided by doping, are of importance here. In addition to doping with copper, chromium, or manganese, iron doping, in particular, is widely used and has proven very efficient for the photorefractive effect. On the one hand, this photorefractive effect is useful for recording volume phase holograms in the crystals. For example, the more effectively the material responds to light, the higher is the level of control with which changes in the refractive index can be achieved, thus allowing holograms to be stored, for example, as Bragg gratings.

On the other hand, the optical damage causes deterioration of the optical properties of a crystal. This "optical damage" does not involve any mechanical damage, but merely causes optical inhomogeneities, which affect the propagation of light. Therefore, light can no longer be guided in a controlled manner due to the optical damage. The light is defocused, resulting in losses, especially in waveguides, and leading to a deterioration of the light intensity profiles used. Thus, the components concerned become inefficient.

This can be remedied, inter alia, by increasing the dark conductivity. This makes it difficult for electric fields to build up in the crystal, so that no photorefractive effect will occur anymore. In this connection, reference is made to DE 10 300 080 A1, the contents of which are fully incorporated herein by reference.

However, a particularly high doping level of the crystals of greater than $1 \times 10^{25}$ m$^{-3}$, especially with iron or elements having a comparable effect, increases the dark conductivity to such an extent that it limits the space charge fields. In particular crystals that are doped with a large amount of iron are highly absorptive to visible light. At high light intensities, this high absorption leads to heating, and thus, to thermal expansion, and also to thermally induced changes in the refractive index which, in turn, degrade the beam profile. Moreover, the light loss due to absorption is inconvenient for the applications.

In this context, the iron occurs at least in the two charge states 2+ and 3+. While iron 3+, being an electron acceptor, does not cause absorption in the visible spectral region, iron 2+, being an electron donator, causes a wide absorption band for green to blue light. In order to change the valency state of the incorporated doping centers, it is known to subject the oxidic crystals to a thermal treatment at temperatures around 1000° C. ("annealing"). For example, when annealed in an oxygen atmosphere, the crystals undergo an oxidation process during which the iron is converted from the 2+ valency state to the 3+ state. However, this process cannot be carried out to any desired extent, so that the known method of treatment typically leaves part of the iron in the 2+ state. However, especially in the case of particularly highly doped crystals, this leads to a not insignificant residual absorption. Thus, absorption generally cannot be reduced to absorption coefficients of less than 2 mm$^{-1}$ using conventional methods.

For other oxidic materials, such as potassium niobate, it is known that thermal treatment in an electric field results in a reduction process instead of an oxidation process. Thus, the change of the charge of the incorporated centers results in a negative valency state.

SUMMARY

It is an object of the present invention to provide a method which can be implemented by simple and inexpensive means, by which crystals are substantially oxidized, and which allows residual absorption in the crystals, such as in lithium niobate or lithium tantalate, to be reduced to a minimum.

One aspect of the present invention is to allow the Fermi level in the crystals to be strongly reduced through "assisted" oxidation. Highly doped crystals are annealed in conjunction with an electric field. In one embodiment, a high voltage of up to 1200 V is additionally applied to the crystal during annealing, said voltage producing currents of sometimes more than 10 mA. Using these currents, the electrons liberated during oxidation are actively removed from the crystal. This assisted oxidation therefore minimizes the residual absorption and leads to accumulation of valency states having low absorption, including no absorption, in the visible spectral region. An advantage of the present invention is that it suppresses absorption while at the same time providing high dark conductivity. Advantages of the present invention manifest themselves strongly in lithium niobate crystals and lithium tantalate crystals.

An embodiment of the present invention makes it is possible to achieve, for example, $Fe^{2+}$ concentrations of less than $1 \times 10^{23}$ m$^{-3}$ when appropriately selecting the parameters.

Another embodiment reduces the $Fe^{2+}$ concentration to values below about $4 \times 10^{24}$ m$^{-3}$, including when the overall level of iron doping is high.

BRIEF DESCRIPTION OF THE DRAWINGS

In the following, the present invention will be described with reference to FIGS. 1 through 4, of which.

DETAILED DESCRIPTION

Figure 1:
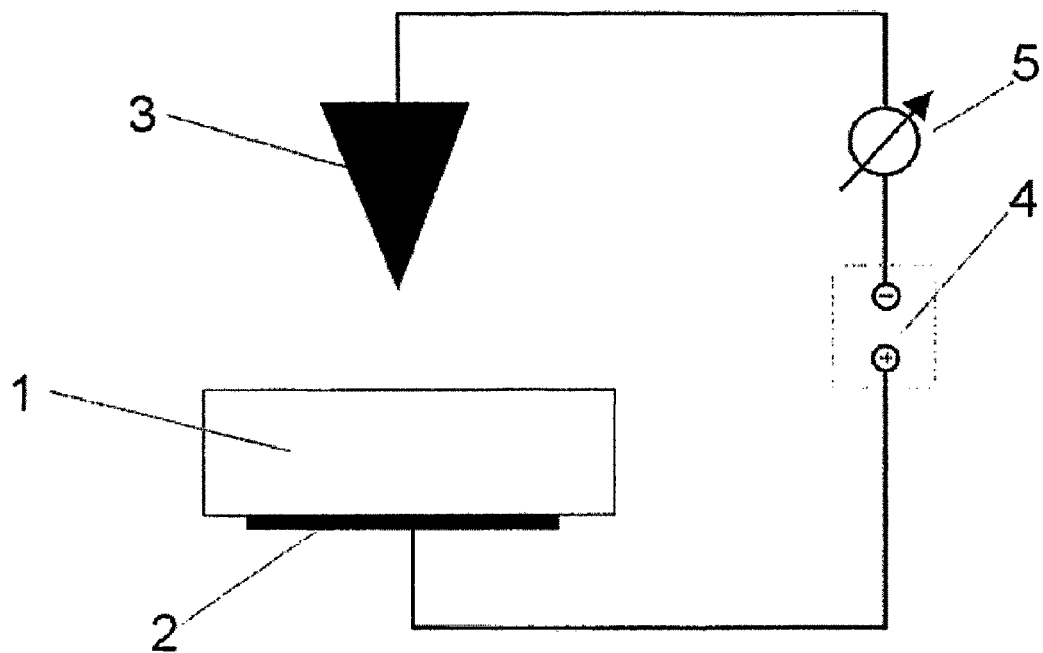
FIG. 1 is a schematic view of a device for thermally and electrically oxidizing a crystal using a corona electrode.

As has already been mentioned, it is known to subject potassium niobate crystals to thermal treatments while at the same time applying an electric voltage.

However, in cases known so far, such treatment led to a reduction process where the existing charge carrier donators and acceptors are increasingly filled with electrons and the Fermi level is raised. This effect, which is known as "electroreduction", therefore goes in an undesired direction.

Although it is conceivable for the electrons liberated during oxidation to be removed from the crystal, it is, nevertheless, particularly easily practicable and therefore advantageous to use the present method of assisting the oxidation by applying thermal energy and an electric field to the crystal.

Furthermore, an embodiment of the method according to the present invention can be used particularly advantageously in combination with the method described in DE 10 300 080 A1. In this case, foreign atoms are initially selectively introduced into the crystal by doping prior to carrying out the method of assisted oxidation.

Thus, the foreign atoms are doping elements. It is also advantageous that the assisted oxidation according to the present invention can convert the doping elements not just to any arbitrary valency state, but to the lowest possible valency state that can be achieved with the means used. It is further significant that the oxidation state reached does not show any absorption.

As also described in DE 10 300 080 A1, it is advantageous if the doping elements used for increasing the dark conductivity are extrinsic ions, in particular iron ions in a concentration of more than $1 \times 10^{25}$ m$^{-3}$.

To be able to carry out embodiments of the method in a particularly effective and simple manner, it is advantageous to place the crystal between two electrodes, such as between two metal electrodes, which are connected to a voltage source. One of the electrodes can take the form of a corona electrode which is not in contact with the crystal, the corona electrode, for instance, being connected to the negative terminal of the voltage source. This allows particularly high fields to be generated inside the crystal in a contactless manner. In another variant which is easy to implement, the crystal can simply be clamped between two electrodes.

In order to improve the likelihood that the free electrodes are "washed out" as completely as possible, a sufficient voltage may be applied between the electrodes. In the case of contacting electrodes, this voltage comprises the range of several volts, including about 10 V. Corona electrodes may be operated at voltages of several hundred V, such as between 800 V and 1200 V. One embodiment is operated at about 1000 V. In particular embodiments, the voltage is selected such that currents of between 0.01 mA and 15 mA, such as about 10 mA, are generated inside the crystal by applying the electric field. It is also advantageous in some embodiments if the application of thermal energy according to the present invention leads to temperatures between about 300° C. and 1200° C., such as between 800° C. and 900° C., inside the crystal. Moreover, the treatment time can be selected such that the desired effect is achieved.

In one method embodiment of the present invention, the iron in the crystals can be substantially completely converted to the charge state 3+. As has been explained, this valency states generally does not cause absorption in the visible spectral region. Thus, the absorption can be effectively suppressed while at the same time providing high dark conductivity. When selecting the parameters as described above, the residual absorption reached is below 0.4 mm$^{-1}$. In this connection, it is an advantage of the present invention that the low optical absorption minimizes thermal effects and limits losses.

Tests included examining the suitability of LiNbO$_3$ crystals when illuminated with focused continuous-wave laser light. In the process, crystals doped with a relatively large amount of iron (approximately 1 percent by weight of Fe$_2$O$_3$ in the melt) were systematically optimized. This was done using an embodiment of the method of the present invention of performing thermal treatment at temperatures between 300° C. and 1200° C., to which the crystals where subjected.

Figure 2:
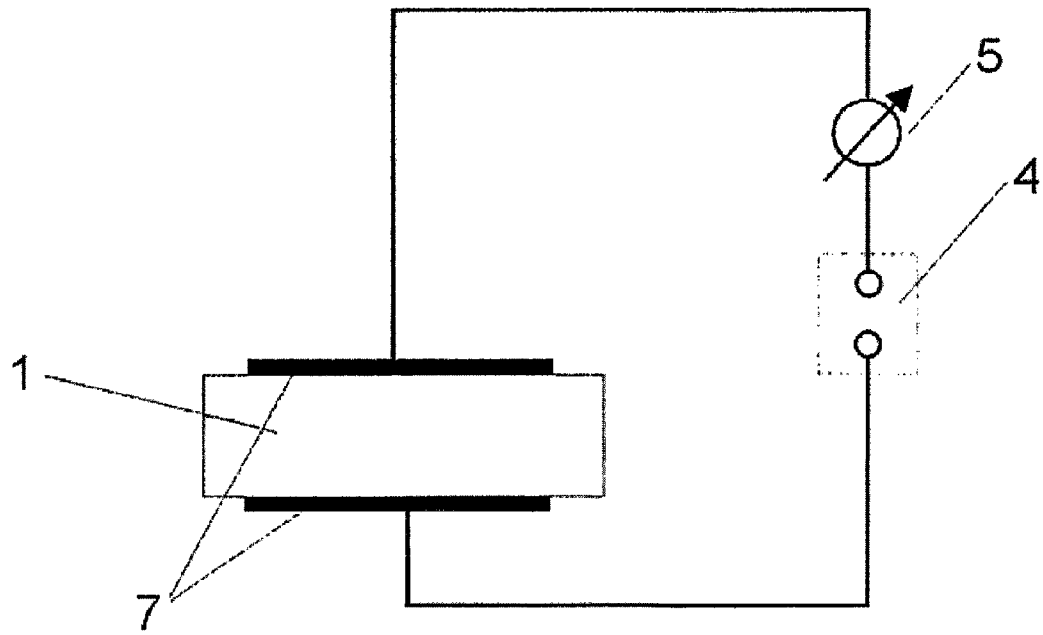
FIG. 2 is a schematic view of the device for thermally and electrically oxidizing a crystal using metal electrodes placed on the crystal surface.

In accordance with one embodiment of the present invention, a thermal treatment with the simultaneous application of voltage is used in iron-doped LiNbO$_3$ or LiTaO$_3$ crystals for nearly complete oxidation. To this end, a voltage is applied to crystal 1 to be treated. The voltage can be applied as shown in FIG. 1, using an individual electrode 2 placed on crystal 1, and an additional corona electrode 3, which is not in contact with crystal 1. In this case, a voltage of about 1000 V is applied. In the example shown in FIG. 2, electrodes 7 made, for example, of metal are placed directly on crystal 1. In this case, a voltage of about 10 V is sufficient.

The voltage is provided by a switchable or controllable power supply 4. A current measuring device 5 allows the occurring currents to be monitored. Crystal 1 is then heated to temperatures between approximately 300 and 1250° C. under the application of a voltage, and maintained at this temperature for several hours, here 900 minutes. This treatment causes heavy oxidation of the crystal.

Figure 3:
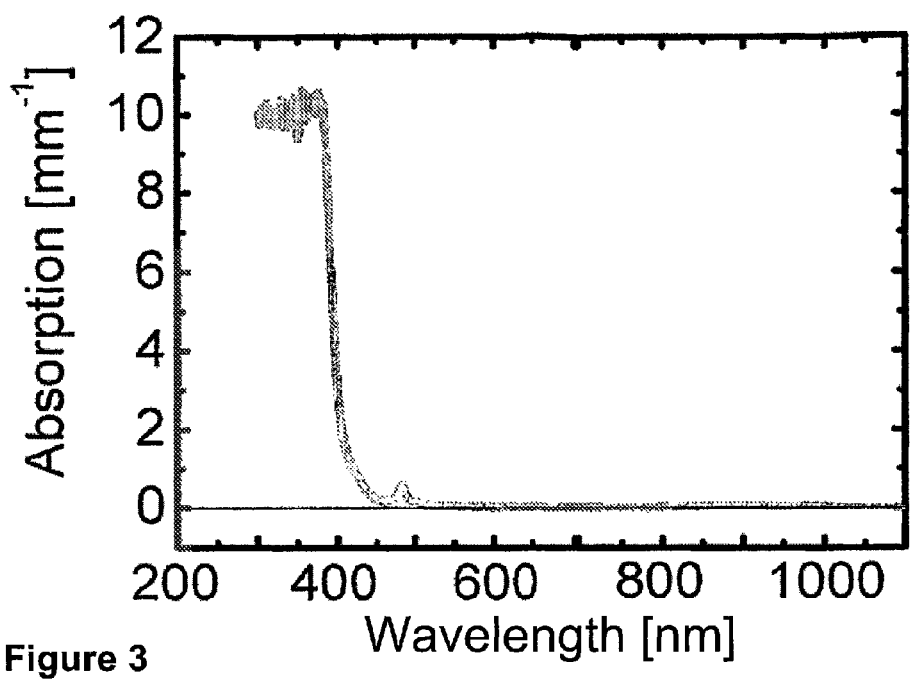
FIG. 3 shows an absorption spectrum of a highly iron-doped crystal which is largely oxidized.
Figure 4:
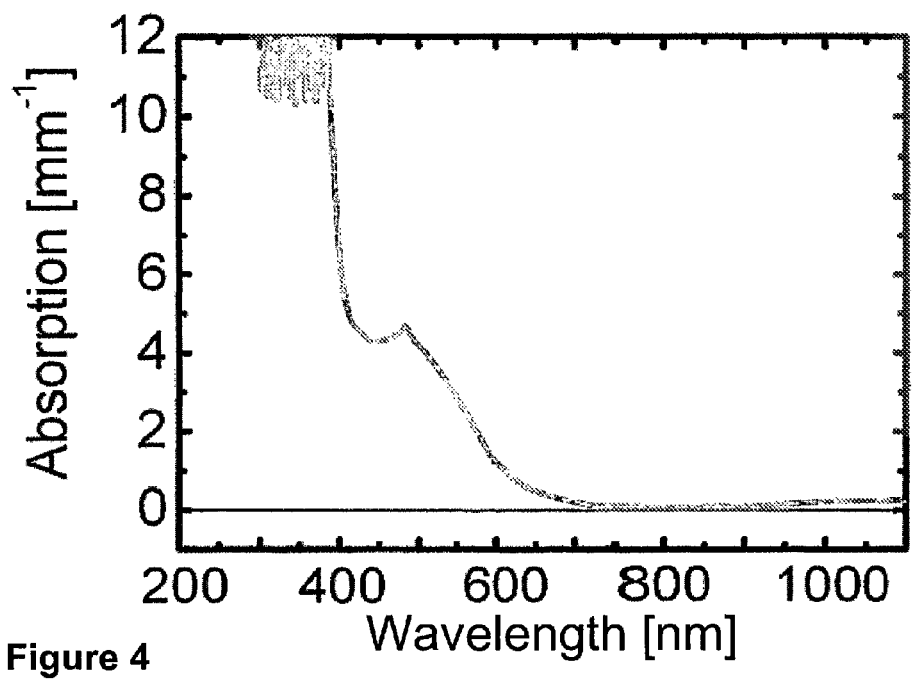
FIG. 4 shows an absorption spectrum of a highly iron-doped crystal which is oxidized using conventional means.

An example of such a treatment is shown in FIG. 3. In the diagram, the absorption coefficient is plotted against wavelength. In the wavelength range from 500 nm to 1100 nm, the absorption is below 0.2 mm$^{-1}$. The absorption band at 482 nm constitutes an exception, which is attributable to a forbidden crystal-field transition. However, as can be clearly seen in FIG. 4, this absorption band is much narrower than the absorption shoulder usually caused by the $Fe^{2+}$. FIG. 4 shows the absorption spectrum of a comparable crystal having the same doping level, which was subjected to a conventional oxidation treatment. Between the band at 482 nm and the fundamental absorption, in the wavelength range from 440 nm to 470 nm, the absorption values are below 4 mm$^{-1}$.

In comparison with the conventional treatment, the method according to the present invention achieves absorption values at least one order of magnitude lower than the values achievable heretofore. As a result, the optical absorption in the visible spectral region is markedly reduced while at the same time providing high dark conductivity.

What is claimed is:

1. A method for treating a crystal having nonlinear optical properties and including foreign atoms which bring about specific absorption of incoming light, the method comprising: converting the foreign atoms in the crystal to a lower valency state by an oxidation process, thereby liberating electrons; removing, during the oxidation process, the liberated electrons from the crystal using an external current source so as to reduce an optical absorption value of the crystal, wherein the crystal comprises one of the following: a lithium niobate crystal and a lithium tantalite crystal.

2. The method as recited in claim 1, wherein the foreign atoms comprise doping elements provided to the crystal by doping prior to the oxidation.

3. The method as recited in claim 2, wherein the doping elements comprise at least one of the following extrinsic ions: iron ions, copper ions, and manganese ions, the extrinsic ions existing in a concentration of more than $1 \times 10^{25}$ m$^{-3}$, and said extrinsic ions increasing the dark conductivity of the crystal.

4. The method as recited in claim 1, wherein the lower valency state comprises 3+.

5. The method as recited in claim 1, further comprising:
placing the crystal between a plurality of electrodes, which are connected to a voltage source; and
applying between the plurality of electrodes a voltage substantially between 1 V and 1200 V.

6. The method as recited in claim 5, wherein one of the electrodes comprises a corona electrode which is not in contact with the crystal, the corona electrode, being connected to a negative terminal of the voltage source.

7. The method as recited in claim 5, wherein the voltage is:
substantially 1000 V if one of the plurality of electrodes comprises a corona electrode which is not in contact with the crystal; and
substantially 10 V if the plurality of electrodes are contacting the crystal.

8. The method as recited in claim 1, wherein the external current source generates a current in the crystal substantially between 0.01 mA and 15 mA.

9. The method as recited in claim 1, wherein the oxidation produces a crystal temperature substantially between 300° C. and 1200° C.

* * * * *